United States Patent
Ott (10) Patent No.: US 10,036,791 B2
(45) Date of Patent: Jul. 31, 2018

(54) MAGNETIC RESONANCE METHOD AND APPARATUS IN WHICH DATA ARE ACQUIRED ALONG K-SPACE SPOKES ORIGINATING FROM K-SPACE CENTER

(71) Applicant: Siemens Aktiengesellschaft, Munich (DE)

(72) Inventor: Martin Ott, Wuerzburg (DE)

(73) Assignee: Siemens Aktiengesellschaft, Munich (DE)

( * ) Notice: Subject to any disclaimer, the term of this patent is extended or adjusted under 35 U.S.C. 154(b) by 627 days.

(21) Appl. No.: 14/678,211

(22) Filed: Apr. 3, 2015

(65) Prior Publication Data

US 2015/0285880 A1    Oct. 8, 2015

(30) Foreign Application Priority Data

Apr. 4, 2014    (DE) .................. 10 2014 206 562

(51) Int. Cl.
*G01V 3/00*     (2006.01)
*G01R 33/48*    (2006.01)
*G01R 33/36*    (2006.01)

(52) U.S. Cl.
CPC ......... *G01R 33/4818* (2013.01); *G01R 33/36* (2013.01); *G01R 33/4824* (2013.01)

(58) Field of Classification Search
CPC ............ G01R 33/4824; G01R 33/5612; G01R 33/5611; G01R 33/561; G01R 33/4826; G01R 33/5635; G01R 33/4816; G01R 33/543; G01R 33/4836; G01R 33/288; G01R 33/56509; G01R 33/5676; G01R 33/583; G01R 33/04; G01R 33/54; G01R 33/56; G01R 33/5617; G01R 33/246; G01R 33/4818; G01R 33/482; G01R 33/56308; G01R 33/56341; G01R 33/5602; G01R 33/5614; G01R 33/5616; G01R 33/5659; G01R 33/34; G01R 33/443;

(Continued)

(56) References Cited

U.S. PATENT DOCUMENTS 6,515,477 B1 * 2/2003 Tasaka ............... G01R 33/4833
                                                  324/306
7,245,125 B2 * 7/2007 Harer ................. G01R 33/4824
                                                  324/307

(Continued)

OTHER PUBLICATIONS

Conolly et al., "Variable-Rate Selective Excitation," Journal of Magnetic Resonance, vol. 78 (1988), pp. 440-458.

(Continued)

*Primary Examiner* — Vinh Nguyen
(74) *Attorney, Agent, or Firm* — Schiff Hardin LLP (57) ABSTRACT

In a method and a magnetic resonance system for acquiring MR data in a predetermined volume segment of an examination subject, an RF excitation pulse is radiated and MR data are acquired along trajectories extending radially through the center of k-space. The MR data of one k-space spoke, which corresponds to one half of a trajectory, are acquired while gradients are switched. Starting from the same RF excitation pulse, only MR data of one k-space spoke are acquired by starting in the k-space center, acquiring the MR data continuously up to the k-space periphery. The echo time is greater than 1 ms.

11 Claims, 4 Drawing Sheets

(58) Field of Classification Search
CPC ............ G01R 33/5607; G01R 33/5673; G01R 33/3415; G01R 33/5601; G01R 33/5608; G01R 33/56366; G01R 33/565; G01R 33/56545; G01R 33/36; G01R 33/3664; G01R 33/38; G01R 33/385; G01R 33/46; G01R 33/4835; G01R 33/4838; G01R 33/485; G01R 33/5619; G01R 33/56325; G01R 33/56518; G01R 33/56563; G01R 33/586; G01R 33/30; G01R 33/307; G01R 33/32; G01R 33/34084; G01R 33/341

See application file for complete search history.

(56) References Cited

U.S. PATENT DOCUMENTS

| | | | | |
|---|---|---|---|---|
| 7,457,655 | B2* | 11/2008 | Welch | G01R 33/4824 600/407 |
| 8,089,278 | B1 | 1/2012 | Du | |
| 2013/0335082 | A1* | 12/2013 | Paul | G01R 33/5615 324/309 |

OTHER PUBLICATIONS

Pauly et al., "A k-Space Analysis of Small-Tip-Angle Excitation," Journal of Magnetic Resonance, vol. 81 (1989) pp. 43-56.

Hennel, "Fast Spin Echo and Fast Gradient Echo MRI With Low Acoustic Noise," Journal of Magnetic Resonance Imaging, vol. 13 (2001) pp. 960-966.

Hennel et al., ""Silent" MRI With Soft Gradient Pulses," Magnetic Resonance in Medicine, vol. 42 (1999), pp. 6-10.

Tyler et al., "Magnetic Resonance Imaging With Ultrashort TE (UTE) Pulse Sequences: Technical Considerations," Journal of Magnetic Resonance Imaging, vol. 25 (2007), pp. 279-289.

Weishaupt et al., "Wie funktioniert MRI," Springer Verlag (2009), pp. 41-48, DOI: 10.1007/978-3-S40-89573-2 7.

Schmitter et al., "Sound pressure level prediction of arbitrary sequences," Proc. Intl. Soc. Mag. Reson. Med., vol. 16 (2008), p. 2965.

Jakob et al., "Mixed-Bandwidth Acquisitions: SNR and Noise Texture," Proc. Intl. Soc. Mag. Reson. Med., (vol. 9) (2001), p. 906.

Haacke et al., "Magnetic Resonance Imaging—Physical Principles and Sequence Design," (1998), pp. 308-315.

Fransson et al., "Properties of the Phase-Alternating Phase-Shift (PHAPS) Multiple Spin-Echo Protocol in MRI: A Study of the Effects of Imperfect RF Pulses," Magnetic Resonance Imaging, vol. 11 (1993), pp. 771-784.

Feinberg, "VET Imaging: Magnetic Resonance Imaging with Variable Encoding Time," Magnetic Resonance in Medicine, vol. 38 (1997), pp. 7-14.

Constable et al., "Factors Influencing Contrast in Fast Spin-Echo MR Imaging," Magnetic Resonance Imaging, vol. 10 (1992), pp. 497-511.

Counter et al., "MRI Acoustic Noise: Sound Pressure and Frequency Analysis," ISMRM, vol. 7, No. 3, pp. 606-611 (1997).

Hedeen et al., "Characterization and Prediction of Gradient Acoustic Noise in MR Imagers," Magnetic Resonance in Medicine, vol. 37, pp. 7-10 (1997).

Shellock et al., "Determination of Gradient Magnetic Field-Induced Acoustic Noise Associated with the Use of Echo Planar and Three-Dimensional, Fast Spin Echo Techniques," Journal of Magnetic Resonance Imaging, vol. 8, No. 5, pp. 1154-1157 (1998).

Yang et al., "A Silent Event-Related Functional MRI Technique for Brain Activation Studies Without Interference of Scanner Acoustic Noise," Magnetic Resonance in Medicine, vol. 43, pp. 185-190 (2000).

Cho et al., "Analysis of Acoustic Noise in MRI," Magnetic Resonance Imaging, vol. 15, No. 7 (1997).

Katsunuma et al., "Quiet MRI with novel acoustic noise reduction," Magnetic Resonance Materials in Physics, Biology and Medicine, vol. 13, pp. 139-144 (2002).

Lu et al., "Rapid Fat-Suppressed Isotropic Steady-State Free Precession Imaging Using True 3D Multiple-Half-Echo Projection Reconstruction," Magnetic Resonance in Medicine, vol. 53, pp. 692-699 (2005).

Bandettini et al., "Functional MRI of Brain Activation Induced by Scanner Acoustic Noise," Magnetic Resonance in Medicine, vol. 39, pp. 410-416 (1998).

Mechefske et al., "Acoustic noise reduction in a 4 T MRI Scanner," MAGMA Magnetic Resonance Materials in Physics, vol. 13, pp. 172-176 (2002).

Larson et al., "Real-Time Cardiac Cine Imaging with SPIDER: Steady-State Projection Imaging With Dynamic Echo-Train Readout," Magnetic Resonance in Medicine, vol. 46, pp. 1059-1066 (2001).

Johnson et al., "Optimized 3D Ultrashort Echo Time Pulmonary MRI," Magnetic Resonance in Medicine, vol. 70, pp. 1241-1250 (2013).

Cho et al., "A New Silent Magnetic Resonance Imaging Using a Rotating DC Gradient," Magnetic Resonance in Medicine, vol. 39, pp. 317-321 (1998).

Price et al., "Investigation of Acoustic Noise on 15 MRI Scanners from 0.2 T to 3 T," Journal of Magnetic Resonance Imaging, vol. 13, pp. 288-293 (2001).

De Zwart et al., "Reduction of Gradient Acoustic Noise in MRI Using SENSE-EPI," NeuroImage, vol. 16, pp. 1151-1155 (2002).

Jung et al., "Self-calibrated Multiple-Echo Acquisition With Radial Trajectories Using the Conjugate Gradient Method (SMART-CG)," Journal of Magnetic Resonance Imaging, vol. 33, pp. 980-987 (2011).

* cited by examiner

MAGNETIC RESONANCE METHOD AND APPARATUS IN WHICH DATA ARE ACQUIRED ALONG K-SPACE SPOKES ORIGINATING FROM K-SPACE CENTER

BACKGROUND OF THE INVENTION

Field of the Invention

The present invention concerns a method and a magnetic resonance system for acquiring MR data in a volume segment of an examination subject.

Description of the Prior Art

In order to acquire MR data, magnetic field gradients are switched (activated), among other things. Considerable current intensities occur when the magnetic field gradients are switched. Because the gradient coils, with which the magnetic field gradients are generated, are located within the main magnetic field (B0 field) of the magnetic resonance system, this causes a Lorentz force to be generated that leads to a mechanical excitation of the gradient coil system of the magnetic resonance scanner. When there is a rapid change in the magnetic field gradients, and hence a rapid change in the Lorentz forces, this results in strong vibrations of the entire structure of the magnetic resonance scanner, and such vibrations can also be transmitted via the ambient air. As a consequence, different levels of loudness exposure are produced, depending on the applied rate of rise or speed of rise (slew rate) of the magnetic field gradients. The loudness generally increases logarithmically with the slew rate of the respective gradient.

SUMMARY OF THE INVENTION

Because the loudness generated by a magnetic resonance scanner is regarded as annoying or even as instilling anxiety by patients who are to be examined, an object of the present invention is to reduce the loudness during the acquisition of MR data in comparison with the prior art.

This object is achieved in accordance with the present invention by a method for acquiring MR data in a predetermined volume segment of an examination subject by operation of a magnetic resonance system that includes application of an RF excitation pulse, and acquisition of the MR data of a k-space spoke while gradients are switched. For this purpose the MR data are acquired along trajectories that proceed radially through the center of k-space. A k-space spoke corresponds to half of such a trajectory. Starting from the same RF excitation pulse, only the MR data of one k-space spoke are acquired, the MR data being acquired first in the k-space center (first end of the k-space spoke) and then continuously up to the k-space periphery (second end of the k-space spoke). In this case the echo time is greater than 1 ms.

In this context the "echo time" means the time period that starts at the point in time at which the RF excitation pulse is at its maximum value, and ends at that point in time at which the acquisition of the MR data of the respective k-space spoke commences.

Selecting an echo time of more than 1 ms advantageously enables the gradients necessary for acquiring the MR data to be switched at such a low rate of rise (slew rate) that the loudness can be kept below a predetermined threshold value.

Because the MR data are acquired along the k-space spokes, which can also be referred to as radial half-projections, no dephasing gradient is required in the readout direction before the MR data are read out or acquired. In other words, due to the MR data being acquired along the k-space spokes it is possible, prior to the readout, to dispense entirely with the dephasing that is known from conventional gradient echo sequences, or this dephasing can at least be severely curtailed, as a result of which very short echo times (e.g. 70 µs) can be achieved. Since, according to the invention, the echo time is nevertheless set to more than 1 ms, the slew rate of all of the gradients can advantageously be kept low at all times. This means, for example, that in spite of a slice thickness of 3 mm the loudness load can be reduced to approx. 75 dB when an echo time of 1.5 ms is employed.

The RF excitation pulse can be a half pulse, particularly in the case of a two-dimensional or slice-by-slice acquisition of the MR data.

Since half pulses are at their maximum at the end of the time interval in which the half-pulse is emitted, only a very small slice rephasing moment must be applied after the half pulse in the slice selection direction.

When the RF excitation pulse is a half pulse, the MR data of each k-space spoke is acquired in particular twice. The slice selection gradient used for the first measurement of the respective k-space spoke has, in comparison with the slice selection gradient used for the second measurement of the same k-space spoke, the same absolute value but a different sign.

Furthermore, it is possible for the slice selection gradient that to be applied simultaneously with the RF excitation pulse is a slice selection gradient varying with time during the application of the RF excitation pulse. In this case the RF excitation pulse and the slice selection gradient can be set or aligned to one another in such a way that the slice selection gradient is already being ramped down while the RF excitation pulse is still being applied. The dephasing moment generated by the slice selection gradient is minimized as a result, such that in the ideal case no slice rephasing moment needs to be generated.

The acquisition of the MR data can begin only when each readout gradient has reached its maximum value, which is also referred to as the flattop method. With this approach, further gradients are switched in advance in order to generate a gradient moment to counterbalance the gradient moment generated due to the ramping up of the readout gradients. In this case these further gradients are preferably switched while the slice selection gradient for rephasing is switched.

It is also possible according to the invention for the acquisition of the MR data to start already during the ramping up of the readout gradients, which is also referred to as ramp sampling.

Compared to the flattop method, the echo time during ramp sampling is shortened further, since effectively the time for ramping up the gradients is saved.

According to the present invention, the MR data can be acquired one slice at a time (i.e. two-dimensionally) or three-dimensionally.

It should be noted that even in the case of a three-dimensional acquisition of the MR data, it is possible to operate with a kind of slice selection gradient in order to excite the volume segment (for example along 60 mm). Since in this case the amplitudes of the slice selection gradient are very low, the gradient moment that is to be rephased in the slice selection direction also turns out correspondingly small, such that the necessary rephasing can be completed within the time period required for the phase encoding. Half pulses can therefore be dispensed with in general in a three-dimensional acquisition of the MR data.

A global, non-selective RF excitation pulse can also be employed for the three-dimensional acquisition of the MR data. Since no slice selection gradient is required for this, there is also no need for a rephasing in the slice selection direction, as a result of which the echo time can be correspondingly shortened.

In the three-dimensional acquisition of the MR data, the MR data are preferably acquired along trajectories which in each case extend through a single three-dimensional k-space center. For this reason three readout gradients are also required in all three spatial directions in order to acquire the MR data along the respective trajectory.

With the three-dimensional acquisition of the MR data, it is, however, also possible, before the MR data are acquired in one spatial direction, to switch a phase encoding gradient by means of which the corresponding slice is effectively set in order then, as in the two-dimensional case, to acquire the MR data along trajectories which extend radially within the slice to a central point in the slice. This approach is also referred to as "stack of stars" sampling.

The slew rate of all of the gradients can be set during the acquisition of the MR data in such a way that said slew rate corresponds at a maximum to a predetermined percentage (e.g. 20%, more preferably 10%, and most preferably 5%) of the maximum slew rate that is possible for the magnetic resonance system for the corresponding gradient.

In other words, the slew rate of each gradient during the entire measurement corresponds at most to the predetermined percentage of the maximum possible slew rate. Even short violations exceeding this percentage limit are not tolerated in this case. As a result, the loudness generated by the magnetic resonance system can advantageously be reduced significantly in comparison with the prior art.

In order to establish the predetermined percentage for a specific magnetic resonance system, the loudness can also be measured in advance in each case for specific slew rates of the respective gradient. Since the loudness increases with increasing slew rate, the predetermined percentage of the maximum possible slew rate can be determined as that percentage of the maximum slew rate of the respective gradient at which the loudness that results at said percentage of the maximum slew rate lies just below or at least not higher than a predetermined loudness threshold value.

A magnetic resonance system for acquiring MR data in a predetermined volume segment in an examination subject is also provided within the scope of the present invention. The magnetic resonance system (apparatus) has an MR scanner with a basic field magnet, a gradient field system, at least one RF antenna, and the apparatus has a control computer for operating the gradient field system and the at least one RF antenna, in order to receive measurement signals picked up by the RF antenna or antennas and to evaluate the measurement signals, and to generate the MR images. The magnetic resonance system is described so that the scanner applies an RF excitation pulse by operation of the at least one RF antenna and to acquire the MR data along trajectories extending radially through the k-space center, in an electronic memory organized as k-space. In the process, the magnetic resonance scanner acquires the MR data of a k-space spoke, which corresponds to one half of a trajectory, by the at least one RF antenna, while the magnetic resonance scanner switches gradients by operation of the gradient field system. In this case, the magnetic resonance scanner acquires, starting from the same RF excitation pulse, only the MR data of one k-space spoke, the magnetic resonance system acquiring the MR data, starting in the k-space center, continuously up to the k-space periphery along the k-space spoke. The echo time is in this case greater than 1 ms.

The advantages of the magnetic resonance system according to the invention substantially correspond in this case to the advantages of the method according to the invention, which have been explained in detail in the foregoing, so there is no need for them to be repeated here.

The present invention also encompasses a non-transitory, computer-readable data storage medium, in particular a computer program or a software product, which can be loaded into a memory of a programmable controller or computer of a magnetic resonance system. Any or all of the described embodiment variants of the method according to the invention can be performed by programming instructions encoded in the storage medium when run in the controller or control device of the magnetic resonance system. These programming instructions may require program means, e.g. libraries and help functions, in order to realize the corresponding embodiment variants of the methods. The programming instructions can be in a source code (e.g. C++) that still needs to be compiled (assembled) and linked or which only needs to be interpreted, or can be in an executable software code that only requires to be loaded into the corresponding computer in order to be executed.

The electronically readable data medium can be a DVD, a magnetic tape or a USB stick, on which electronically readable control information, in particular software (cf. above), is stored.

The present invention enables a significant reduction in the loudness of a magnetic resonance system in spite of short echo times and in spite of small slice thicknesses.

BRIEF DESCRIPTION OF THE DRAWINGS

FIG. 3 shows a two-dimensional sequence according to the invention, the MR data being acquired along the k-space spokes as soon as the readout gradients are switched on.

DESCRIPTION OF THE PREFERRED EMBODIMENTS

Figure 1:
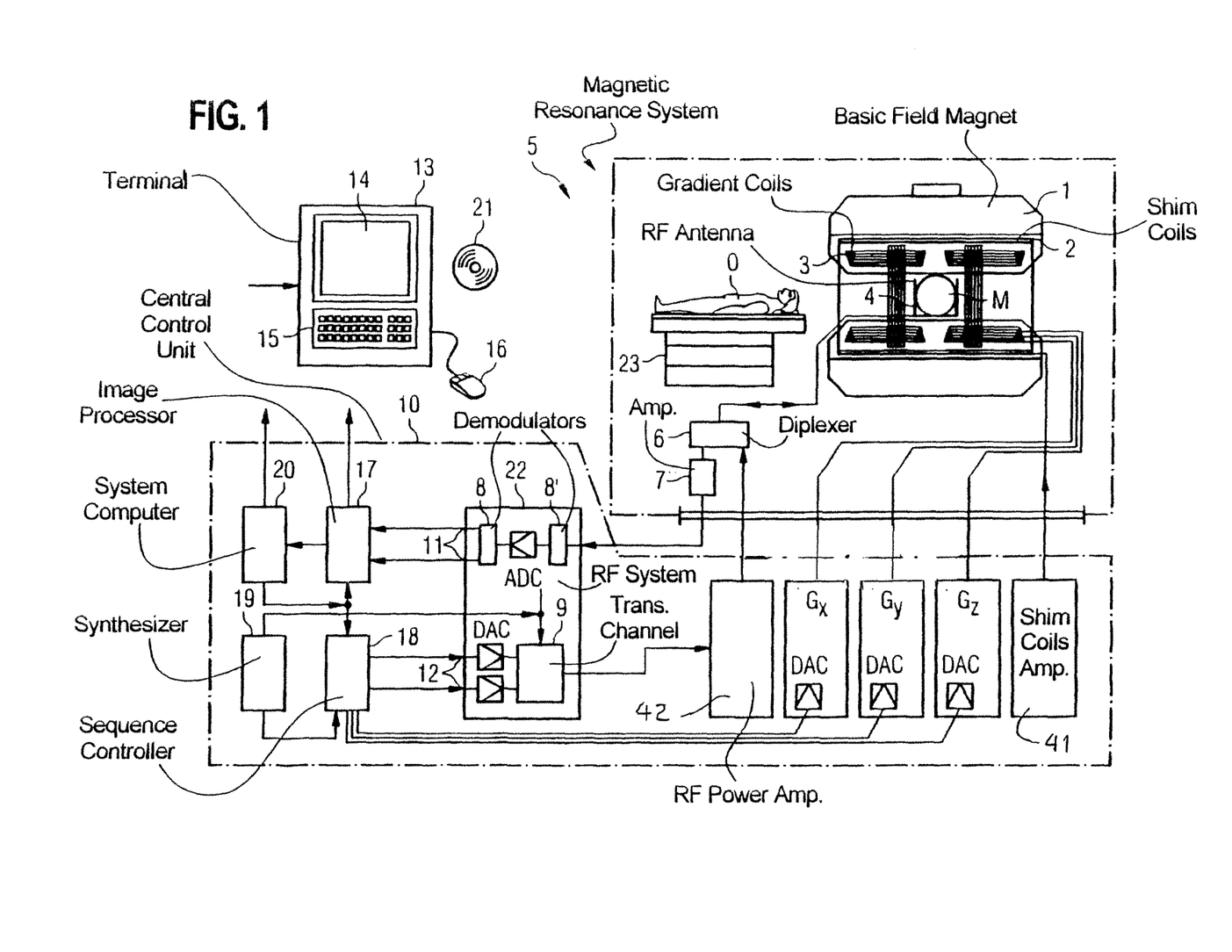
FIG. 1 schematically illustrates a magnetic resonance system according to the invention.

FIG. 1 is a schematic illustration of a magnetic resonance system 5 (a magnetic resonance imaging or nuclear spin tomography apparatus). A basic field magnet 1 generates a strong magnetic field that is constant with respect to time in order to polarize or align the nuclear spins in an examination region of an object O, such as e.g. a part of a human body that is to be examined, lying on a table 23 in the magnetic resonance system 5. The high degree of homogeneity of the basic magnetic field that is required for the data acquisition is defined in a typically spherical measurement volume M in which the parts of the human body that are to be examined are arranged. In order to support the homogeneity requirements and in particular to eliminate time-invariable influences, elements called shim plates made of ferromagnetic material are mounted at suitable points. Time-variable influences are eliminated by means of shim coils 2 supplied with current by a shim coils amplifier 41.

A cylinder-shaped gradient field system or gradient field system 3 composed of three sub-windings is inserted into the basic field magnet 1. Each sub-winding is supplied with electric current by an amplifier for the purpose of generating a linear (also time-variable) gradient field in respective directions of the coordinate system. In this case the first sub-winding of the gradient field system 3 generates a gradient $G_x$ in the x-direction, the second sub-winding generates a gradient $G_y$ in the y-direction, and the third sub-winding generates a gradient $G_z$ in the z-direction. The amplifier comprises a digital-to-analog converter which is driven by a sequence controller 18 for generating gradient pulses at the correct time.

Located within the gradient field system 3 are one or more radio-frequency antennas 4 that convert the radio-frequency pulses emitted by a radio-frequency power amplifier 42 into an alternating magnetic field for exciting the nuclei and aligning the nuclear spins of the object O that is to be examined or of the region of the object O that is to be examined. Each radio-frequency antenna 4 has one or more RF transmit coils and one or more RF reception coils in the form of a ring-shaped, preferably linear or matrix-like, arrangement of component coils. The alternating field emanating from the precessing nuclear spins, i.e. usually the nuclear spin echo signals induced by a pulse sequence composed of one or more radio-frequency pulses and one or more gradient pulses, is also converted by the RF reception coils of the respective radio-frequency antenna 4 into a voltage (measurement signal) which is supplied via an amplifier 7 to a radio-frequency receive channel 8 of a radio-frequency system 22. The radio-frequency system 22, which is part of a control computer 10 of the magnetic resonance system 5, additionally comprises a transmission channel 9 in which the radio-frequency pulses for exciting the magnetic nuclear resonance are generated. The respective radio-frequency pulses are represented digitally as a sequence of complex numbers on account of a pulse sequence predefined by the system computer 20 in the sequence controller 18. This number sequence is supplied in the form of a real part and an imaginary part via respective inputs 12 to a digital-to-analog converter in the radio-frequency system 22, and from the latter to a transmit channel 9. In the transmit channel 9, the pulse sequences are modulated onto a radio-frequency carrier signal, the fundamental frequency of which corresponds to the resonance frequency of the nuclear spins in the measurement volume.

Switching between transmit and receive mode is accomplished by a transmit-receive duplexer 6. The RF transmit coils of the radio-frequency antenna(s) 4 radiate the radio-frequency pulses for exciting the nuclear spins into the measurement volume M and resulting echo signals are sampled by way of the RF receive coil(s). The correspondingly obtained resonance signals are demodulated in the receive channel 8' (first demodulator) of the radio-frequency system 22 in a phase-sensitive manner to an intermediate frequency, digitized in the analog-to-digital converter (ADC), and emitted via the output interface 11. This signal is also demodulated to the frequency 0. The demodulation to the frequency 0 and the separation into real and imaginary part take place after the digitization in the digital domain in a second demodulator 8. An MR image is reconstructed by means of an image computer 17 from the measurement data obtained in said way via an output 11. The management of the measurement data, the image data and the control programs is handled by way of the system computer 20. Based on specifications by means of control programs, the sequence controller 18 controls the generation of the pulse sequences desired in each case and the corresponding sampling of the k-space. In particular, the sequence controller 18 in this case controls the switching of the gradients at the correct time, the transmission of the radio-frequency pulses at the defined phase amplitude, and the reception of the nuclear resonance signals. The time base for the radio-frequency system 22 and the sequence controller 18 is provided by a synthesizer 19. Corresponding control programs for generating an MR image, which are stored e.g. on a DVD 21, are selected and the generated MR image is displayed by way of a terminal 13 which comprises a keyboard 15, a mouse 16 and a screen 14.

Figure 2:
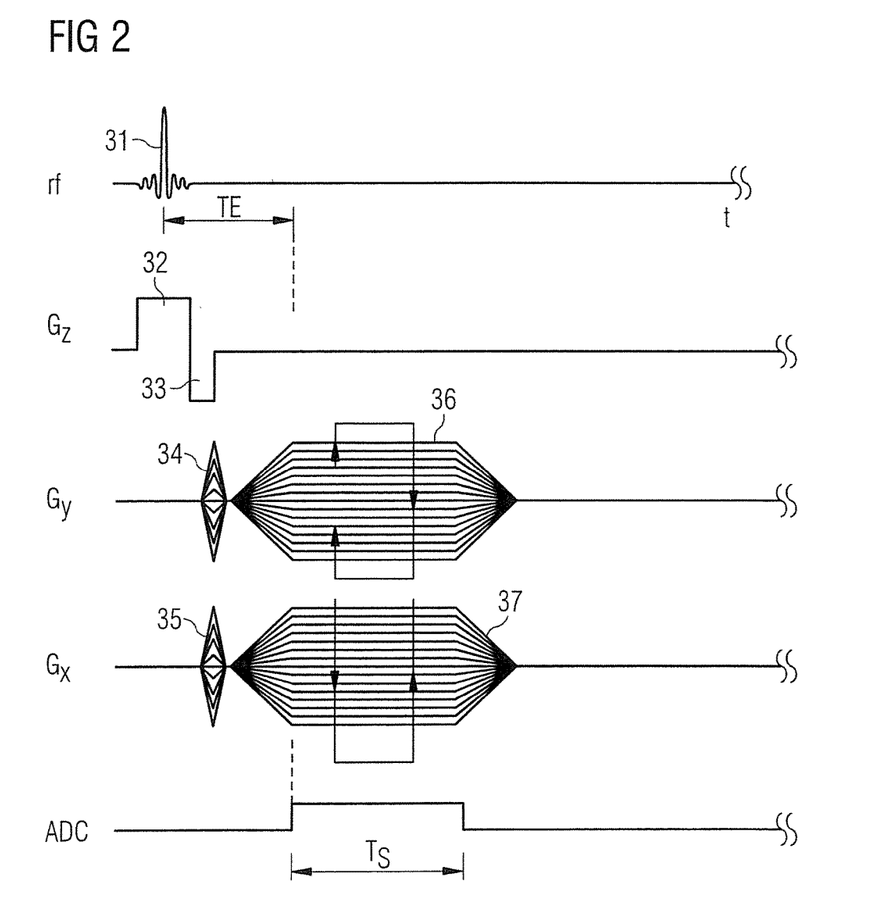
FIG. 2 shows a two-dimensional sequence according to the invention, wherein the MR data are acquired along the k-space spokes only after the readout gradients have reached their respective maximum value.

FIG. 2 shows a sequence according to the invention by which k-space is sampled (MR data are entered therein) one slice at a time. In this case the MR data are acquired only when the readout gradients Gx, Gy, or 36, 37, have reached their maximum value.

According to the invention, the MR data are acquired along trajectories that extend radially through the center k-space, as will be described in detail with reference to FIG. 4. In order to acquire the MR data along a k-space spoke, which corresponds in each case to one half of a trajectory, an RF excitation pulse 31 is radiated while at the same time a slice selection gradient 32 is switched. In order to compensate for the dephasing effect of the slice selection gradient 32, a gradient 33 is switched subsequently in time to the slice selection gradient 32, thereby generating a gradient moment that effectively nullifies the effect of the dephasing gradient moment of the slice selection gradient 32 (i.e. same absolute value, but different signs).

Simultaneously with the gradient 33, the gradients 34, 35 are switched along the spatial directions x and y, which in each case reside perpendicularly to the slice selection direction z. These gradients 34, 35 generate a gradient moment that, in terms of absolute value, corresponds to that gradient moment generated by the readout gradients 36, 37 when ramping up (i.e. from the time point at which the readout gradients 36, 37 are switched on until they reach their maximum value). Since the sign of the gradient moment generated by the gradients 34, 35 is the exact opposite of the sign of the gradient moment generated during the ramping up of the readout gradients 36, 37, a kind of gradient echo occurs at the start of the readout of the MR data (i.e. at the start of the measurement time $T_S$). The echo time TE corresponds in this case to the time interval which starts at the time point of the maximum value of the RF excitation pulse 31 and ends at the start of the measurement time $T_S$. During the measurement time $T_S$, the readout gradients 36, 37 are at their maximum value and the MR data of a k-space spoke is read out.

The sequence shown in FIG. 2 is executed for each k-space spoke in order to acquire the MR data of the respective k-space spoke.

Figure 3:
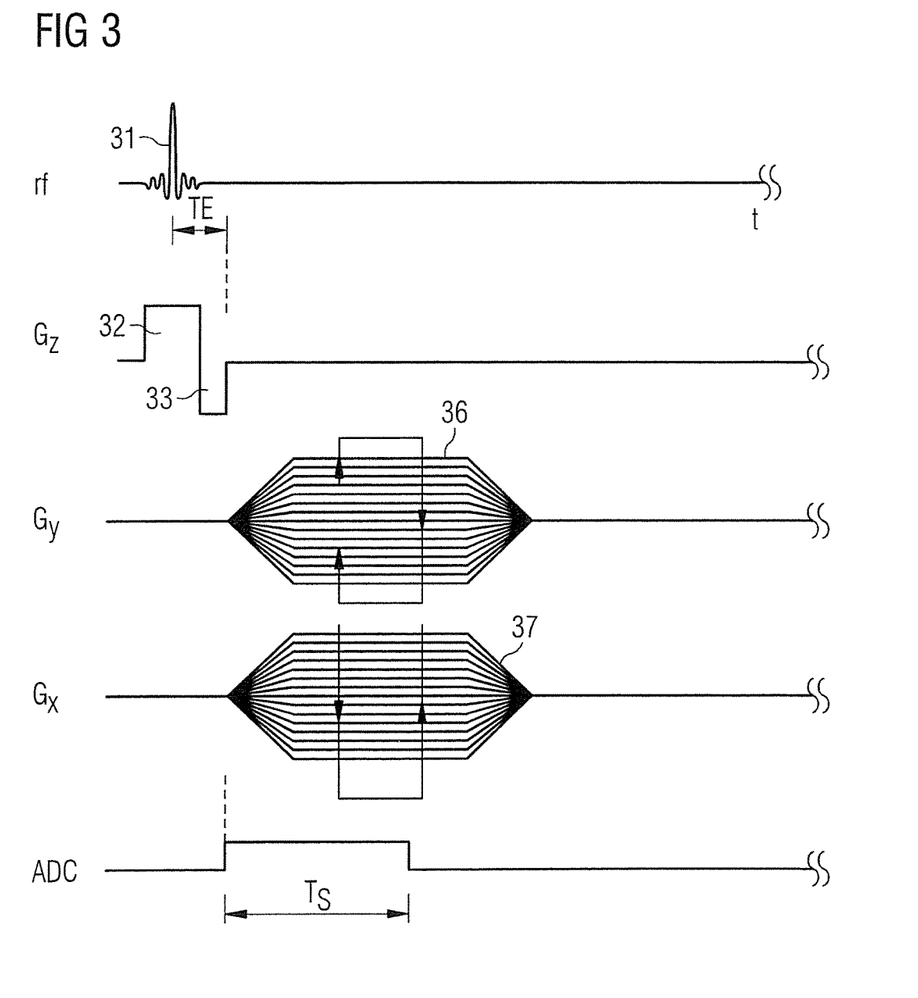

FIG. 3 shows a further inventive sequence for acquiring MR data along a k-space spoke.

In contrast to the sequence shown in FIG. 2, however, the acquisition of the MR data in the case of the sequence shown in FIG. 3 begins already with the switching-on of the readout gradients 36, 37. The gradients 34, 35 (see FIG. 2) are therefore not required, for which reason the free induction decay (and not a gradient echo) is acquired during the sequence of FIG. 3. This acquisition of the MR data while the readout gradients 36, 37 are being ramped up is also referred to as ramp sampling. Since the time interval in which the readout gradients 36, 37 are ramped up is effectively saved, the echo time TE is shorter in the sequence of FIG. 3 than in the sequence of FIG. 2.

In the same way as in the case of the sequence shown in FIG. 2, the sequence shown in FIG. 3 is played out correspondingly for each k-space spoke in order to acquire the MR data of the respective k-space spoke.

Figure 4:
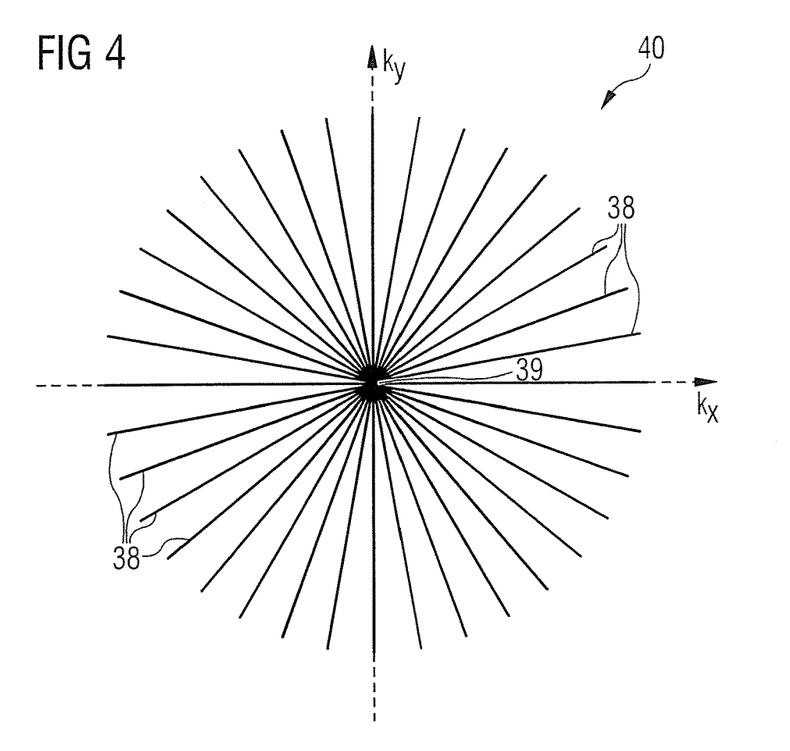
FIG. 4 shows k-space spokes according to the invention in the k-space.

FIG. 4 shows the k-space spokes 38 according to the invention in the k-space 40.

It can be seen that each k-space spoke 38 starts in the k-space center 39 and ends at the periphery of the k-space 40. Since the k-space 40 is sampled on the basis of said k-space spokes 38, which can also be referred to as radial half-projections, the k-space center 39 is read out right at the start of the data acquisition, as a result of which the echo time TE can be kept very short.

Figure 5:
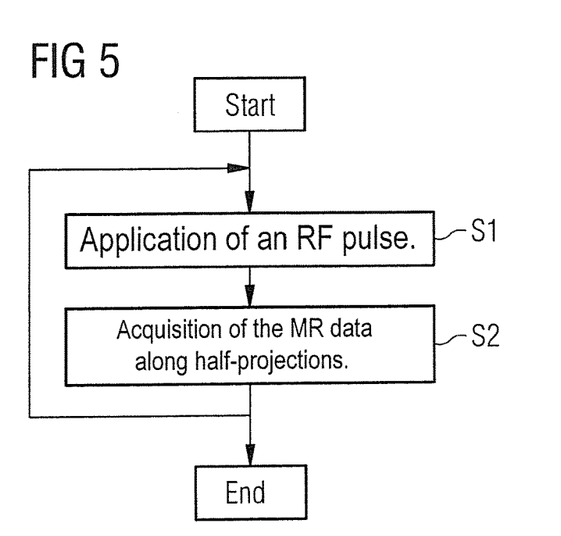
FIG. 5 is a flowchart of a sequence according to the invention.

FIG. 5 is a flowchart explaining the acquisition of the MR data according to the invention.

In order to acquire the MR data along a half-projection or, as the case may be, k-space spoke 38, the RF excitation pulse 31 is applied in the first step S1. The MR data are then acquired along the respective half-projection in step S2. Steps S1, S2 are repeated in the order given as often as necessary until the MR data in the entire k-space 40 has been acquired.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for acquiring magnetic resonance (MR) data comprising:
   (a) from a control computer, emitting control signals to an MR scanner that cause the MR scanner, while an examination subject is situated in the MR scanner, to radiate a radio-frequency (RF) excitation pulse, and to apply at least one magnetic field gradient to excite nuclear spins in a predetermined volume of the examination subject and to acquire MR data at an echo time that follows said RF excitation pulse said echo time being greater than 1 ms, from the excited nuclear spins;
   (b) from said control computer, entering the acquired MR data into an electronic memory, organized as k-space, along one k-space spoke defined by said at least one magnetic field gradient, said one k-space spoke proceeding radially and starting from a center of k-space toward a periphery of k-space, said MR data being entered along said one k-space spoke continuously from said center of k-space toward said periphery of k-space;
   (c) repeating (a) and (b) for each of a plurality of further k-space spokes in k-space; and
   (d) from said control computer, providing the MR data entered along said spokes in k-space available in electronic form, as a data file to an image processor; and
   (e) in said image processor, reconstructing image data from said MR data entered along said spokes in k-space, and displaying an image of the examination subject represented by said image data at a display screen in communication with said image processor.

2. A method as claimed in claim 1 comprising, from said control computer, operating said MR scanner to radiate said RF excitation pulse as a half pulse.

3. A method as claimed in claim 2 comprising:
   operating said MR scanner to acquire MR data for each k-space spoke twice, and for each acquisition of MR data of each k-space spoke, activating, as said at least one magnetic field gradient, a slice selection gradient having a gradient curve; and
   from said control computer, operating said MR scanner to activate said slice selection gradient for one acquisition of MR data for a respective k-space spoke with said curve of said slice selection gradient being a negative of the curve of the slice selection gradient activated for the other acquisition of the respective k-space spoke.

4. A method as claimed in claim 1 comprising:
   in (a), simultaneously with radiation of RF pulse, activating a slice selection gradient, as said at least one magnetic field gradient, that varies with time during radiation of said RF pulse; and
   from said control computer, radiating said RF pulse and said slice selection gradient with said slice selection gradient decreasing in amplitude while said RF pulse is being radiated, and thereby minimizing a dephasing moment produced by said slice selection gradient.

5. A method as claimed in claim 1 wherein, in (a), applying said at least one gradient magnetic field comprises:
   activating a plurality of gradient magnetic fields that include a readout gradient, and acquiring said MR data only when said readout gradient reaches a maximum amplitude; and
   activating further gradient magnetic fields, among said plurality of gradient magnetic fields, that produce a gradient moment that cancels a gradient moment during increase of said readout gradient, and activating a slice selection gradient that rephases said nuclear spins.

6. A method as claimed in claim 1 comprising, in (a), coinciding activation of said at least one gradient magnetic field with said echo time.

7. A method as claimed in claim 1 wherein said volume of said examination subject comprises a plurality of slices of the examination subject, and repeating (a) and (b) for each of said slices.

8. A method as claimed in claim 1 comprising, in (a), acquiring said MR data three-dimensionally by operating said MR scanner to activate three magnetic field gradients, respectively in three orthogonal directions, during acquisition of said MR data.

9. A method as claimed in claim 1 wherein said at least one gradient magnetic field gradient has a maximum slew rate associated therewith, and, in (a), activating said at least one gradient magnetic field with a slew rate that does not exceed a predetermined percentage of said maximum slew rate.

10. A magnetic resonance (MR) apparatus comprising:
    an MR scanner comprising a radio-frequency (RF) antenna arrangement and a gradient coil system;
    an electronic memory organized as k-space;
    an image processor;
    a control computer configured to (a) emit control signals to said MR scanner, while an examination subject is situated in the MR scanner, that operate the MR scanner so as to radiate a radio-frequency (RF) excitation pulse from said RF antenna arrangement, and so as to apply at least one magnetic field gradient from said gradient coil system, in order to excite nuclear spins in a predetermined volume of the examination subject and to acquire MR data at an echo time that follows said RF excitation pulse said echo time being greater than 1 ms, from the excited nuclear spins, (b) enter the acquired MR data into said electronic memory along one k-space spoke defined by said at least one magnetic field gradient, said one k-space spoke proceeding radially and starting from a center of k-space toward a periphery of k-space, said MR data being entered along said one k-space spoke continuously from said center of k-space toward said periphery of k-space, (c) repeat (a) and (b) for each of a plurality of further k-space spokes in k-space, and (d) make the MR data entered along said spokes in k-space available in electronic form, as a data file to said image processor; and said image processor being configured to reconstruct image data from said MR data entered along said spokes in k-space, and to display an image of the examination subject represented by said image data at a display screen in communication with said image processor.

11. A non-transitory, computer-readable data storage medium encoded with programming instructions, said storage medium being loaded into a computer system of a magnetic resonance (MR) apparatus that comprises an MR scanner and an electronic memory that is organized as k-space, said programming instructions causing said computer system to;

(a) provide control signals to the MR scanner, while an examination subject is situated in the MR scanner, in order to cause the MR signal to radiate a radio-frequency (RF) excitation pulse and to apply at least one magnetic field gradient, in order to excite nuclear spins in a predetermined volume of the examination subject and to acquire MR data at an echo time that follows said RF excitation pulse said echo time being greater than 1 ms, from the excited nuclear spins;

(b) enter the acquired MR data into said electronic memory along one k-space spoke defined by said at least one magnetic field gradient, said one k-space spoke proceeding radially and starting from a center of k-space toward a periphery of k-space, said MR data being entered along said one k-space spoke continuously from said center of k-space toward said periphery of k-space;

(c) repeat (a) and (b) for each of a plurality of further k-space spokes in k-space; and (d) reconstruct the MR data entered along said spokes in k-space available in electronic form, as a data file into image data, and display an image represented by said image data at a display screen in communication with said computer system.

\* \* \* \* \*